(12) United States Patent
Jeong et al.

(10) Patent No.: US 7,791,158 B2
(45) Date of Patent: Sep. 7, 2010

(54) CMOS IMAGE SENSOR INCLUDING AN INTERLAYER INSULATING LAYER AND METHOD OF MANUFACTURING THE SAME

(75) Inventors: Hee-Geun Jeong, Suwon-si (KR);
Jae-Seob Roh, Anyang-si (KR);
Seok-Ha Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 881 days.

(21) Appl. No.: 11/385,958

(22) Filed: Mar. 21, 2006

(65) Prior Publication Data

US 2006/0231898 A1 Oct. 19, 2006

(30) Foreign Application Priority Data

Apr. 13, 2005 (KR) ............... 10-2005-0030738
Jun. 20, 2005 (KR) ............... 10-2005-0053014

(51) Int. Cl.
*H01L 31/0232* (2006.01)
(52) U.S. Cl. .................. 257/440; 257/294; 257/435
(58) Field of Classification Search ........... 257/294, 257/435, 440
See application file for complete search history.

(56) References Cited

U.S. PATENT DOCUMENTS

| 5,043,790 | A | * | 8/1991 | Butler | ............... | 257/383 |
| 5,493,143 | A | * | 2/1996 | Hokari | ............... | 257/432 |
| 6,030,852 | A |   | 2/2000 | Sano et al. | | |
| 2004/0142501 | A1 | * | 7/2004 | Nakai et al. | ............... | 438/22 |
| 2005/0062863 | A1 | * | 3/2005 | Takeuchi et al. | ............... | 348/272 |
| 2005/0110094 | A1 | * | 5/2005 | Kuwazawa | ............... | 257/359 |
| 2006/0145223 | A1 | * | 7/2006 | Ryu | ............... | 257/294 |
| 2006/0192083 | A1 | * | 8/2006 | Fu et al. | ............... | 250/214.1 |

FOREIGN PATENT DOCUMENTS

| JP | 2000 150845 | 5/2000 |
| JP | 2001 196568 | 7/2001 |
| JP | 2003-204050 | 7/2003 |
| KR | 1020010061339 | 7/2001 |

OTHER PUBLICATIONS

English Abstract of Publication No. 2000-150845.
English Abstract of Publication No. 2001-196568.

* cited by examiner

*Primary Examiner*—Howard Weiss
*Assistant Examiner*—Tifney L Skyles
(74) *Attorney, Agent, or Firm*—F. Chau & Associates, LLC

(57) ABSTRACT

Provided are a CMOS image sensor and a method of manufacturing the same. The CMOS image sensor includes a semiconductor substrate having photodiodes and transistors. An interlayer insulating layer is formed on the resultant structure having the photodiodes and transistors, and light blocking patterns are formed on the interlayer insulating layer to surround the peripheries of the photodiodes.

29 Claims, 10 Drawing Sheets

CMOS IMAGE SENSOR INCLUDING AN INTERLAYER INSULATING LAYER AND METHOD OF MANUFACTURING THE SAME

CROSS-REFERENCE TO RELATED PATENT APPLICATIONS

This application claims priority to Korean Patent Application Nos. 10-2005-0030738, filed on Apr. 13, 2005, and 10-2005-0053014, filed on Jun. 20, 2005, the disclosures of which are herein incorporated by reference in their entirety.

BACKGROUND OF THE INVENTION

1. Technical Field

The present invention relates to a solid state imaging device and a method of manufacturing the same and, more particularly, to a Complementary Metal Oxide Semiconductor (CMOS) image sensor and a method of manufacturing the same.

2. Description of the Related Art

Image sensors convert optical images into electrical signals. Image sensors can be classified into Charge Coupled Device (CCD) image sensors and CMOS image sensors. The CCD image sensor has a complicated driving system and a complicated manufacturing process. Signal processing circuits are difficult to fabricate in one CCD chip. In contrast, the CMOS image device can be fabricated by standard CMOS techniques. Recent research on image sensors has been focused on the CMOS image sensor.

The CMOS image sensor includes a plurality of unit pixels for photoelectrically converting incident light. FIG. 1A is a circuit diagram illustrating a unit pixel of a conventional CMOS image sensor. Referring to FIG. 1A, the unit pixel includes a photodiode 15 for sensing light, and a transfer transistor 20 that transfers the charges generated by the photodiode 15. Additionally, a reset transistor Rx periodically resets a floating diffusion region FD that stores the transferred charges, and a source follower SF buffers the signals resulting from the charges stored in the floating diffusion region FD. The source follower SF shown in FIG. 1A consists of two serially-connected MOS transistors M1 and R1.

FIG. 1B shows a unit pixel of the CMOS image sensor of FIG. 1A having a photodiode and a transfer transistor integrated on a semiconductor substrate. Referring to FIG. 1B, the photodiode 15 and the transfer transistor 20 are formed in a semiconductor substrate 11 such that photodiode 15 is disposed on one side of the transfer transistor 20. As is well known in the art, the transfer transistor 20 includes a gate electrode 21 and source and drain regions 22a and 22b. In this case, the source and drain regions 22a and 22b are respectively connected to an external power source (not shown) using multilayered metal interconnects 25 and 30. An interlayer insulating layer 23 is interposed between the first metal interconnect 25 and the semiconductor substrate 11, and an interlayer insulating layer 27 is interposed between the first metal interconnect 25 and the second metal interconnect 30. A light blocking layer 40 is formed on the resultant structure having the transistor 20. The metal interconnects 25 and 30 may be formed of a conductive shielding material, e.g., aluminum.

Reducing pixel size to increase pixel density in the CMOS image sensor leads to crosstalk between adjacent pixels. The crosstalk is caused by the migration of electrons (e) produced within the semiconductor substrate 11 due to the photoelectric effect resulting from an incoming optical energy and by inclined incident light 50 with wide angle of incidence (i.e., the angle between the incident light direction and normal direction of metal interconnects 25 and 30). The crosstalk resulting from the electron migration caused by the photoelectric effect is generally negligible, but the inclined incident light 50 can result in large crosstalk in the CMOS image sensor.

Referring to FIG. 1B, the inclined incident light 50 causes crosstalk because the metal interconnects 25 and 30 and the light blocking layer 40 disposed around the corresponding photodiode 15 mutually reflect the incident light 50 incident on another photodiode disposed adjacent to photodiode 15. Such crosstalk makes it difficult to recover data from individual pixels, and may cause color blurring or may brighten the surrounding area when picking up a bright image, making it difficult to accurately capture the image.

The CMOS image sensor includes a color filter to realize a color image. The color filter has R (red), G (green), and B (blue) unit filters. The respective unit filters are arranged to correspond to respective unit pixels.

The R, G, B filters absorb light of specific wavelengths. In particular, the R filter absorbs the long wavelength light of about 660~700 nm, the G filter absorbs the intermediary wavelength light of about 510~590 nm, and the B filter absorbs the short wavelength light of about 490~510 nm. Therefore, since the R filter absorbs light with the long wavelength, electron-hole recombination is carried out deeply in the substrate (photodiode region) in view of the unit pixel (hereinafter referred to as an "R filter region") having the R filter, and no electron-hole is lost to allow for excellent photo sensitivity.

However, because the B filter absorbs the short wavelength light, the electron-hole recombination is at the surface of the photodiode, i.e., a p-type photodiode region. As is well known in the art, the p-type photodiode region is provided to remove a dark source of the CMOS image sensor rather than sensing the light. Accordingly, negligible photogenerated electron-hole recombination occurs to significantly lower the photo sensitivity.

Therefore, even though the unit pixels are formed under the same condition, the light absorption of the filters causes the photo sensitivity to differ between the unit pixel with the R filter and the unit pixel with the B filter. Accordingly, in the conventional CMOS image sensor, photo sensitivity is inconsistent.

SUMMARY OF THE INVENTION

Exemplary embodiments of the present invention provide CMOS image sensors and methods of manufacturing CMOS image sensors.

According to an exemplary embodiment of the present invention, a CMOS image sensor comprises: a semiconductor substrate having photodiodes and transistors; an interlayer insulating layer formed on the resultant structure having the photodiodes and transistors; and light blocking patterns formed on the interlayer insulating layer, and surrounding peripheries of the photodiodes.

The light blocking pattern may comprise a layer selected from a group consisting of a tungsten layer, a titanium layer, a titanium nitride layer, and a stacked layer of titanium and titanium nitride.

According to another exemplary embodiment of the present invention, a CMOS image sensor comprises: a semiconductor substrate having photodiodes and transistors; an interlayer insulating layer formed on the resultant structure having the photodiodes and transistors; molding portions formed on the interlayer insulating layer, and composed of an light blocking material to surround peripheries of the photodiodes; a floatable oxide layer formed on the interlayer insulating layer having the molding portions, and having indented portions formed by steps of the molding portions; and inner lenses formed within the indented portions of the floatable oxide layer.

According to another exemplary embodiment of the present invention, a CMOS image sensor comprises: a semiconductor substrate including a plurality of unit pixels having photodiodes and transistors; an interlayer insulating layer formed on the semiconductor substrate; molding portions formed on an upper surface of the interlayer insulating layer, and surrounding the photodiodes per unit pixels; a floatable oxide layer formed on an upper surface of the interlayer insulating layer, and having indented portions defined by the molding portions; inner lenses respectively formed in the indented portions; and R, G and B color filters formed on an upper surface of the semiconductor substrate having the inner lenses, and arranged under a prescribed rule to correspond to the inner lenses, wherein the molding portions are formed to allow areas of the photodiode regions exposed by the molding portions to be gradually increased in order of the R, G and B filters, thereby increasing apertures and curvatures of the inner lenses in order of the R, G and B filters.

According to another exemplary embodiment of the present invention, a method of manufacturing a CMOS image sensor comprises: providing a semiconductor substrate having photodiode and transistors; forming an interlayer insulating layer on an upper surface of a resultant structure of the semiconductor substrate; forming molding portions on the interlayer insulating layer to surround the peripheries of the photodiodes; and forming a floatable oxide layer on the interlayer insulating layer having the molding portions, and having indented portions corresponding to the photodiodes.

BRIEF DESCRIPTION OF THE DRAWINGS

The present invention will become readily apparent to those of ordinary skill in the art when descriptions of exemplary embodiments thereof are read with reference to the accompanying drawings.

DETAILED DESCRIPTION OF EXEMPLARY EMBODIMENTS

Figure 1A:
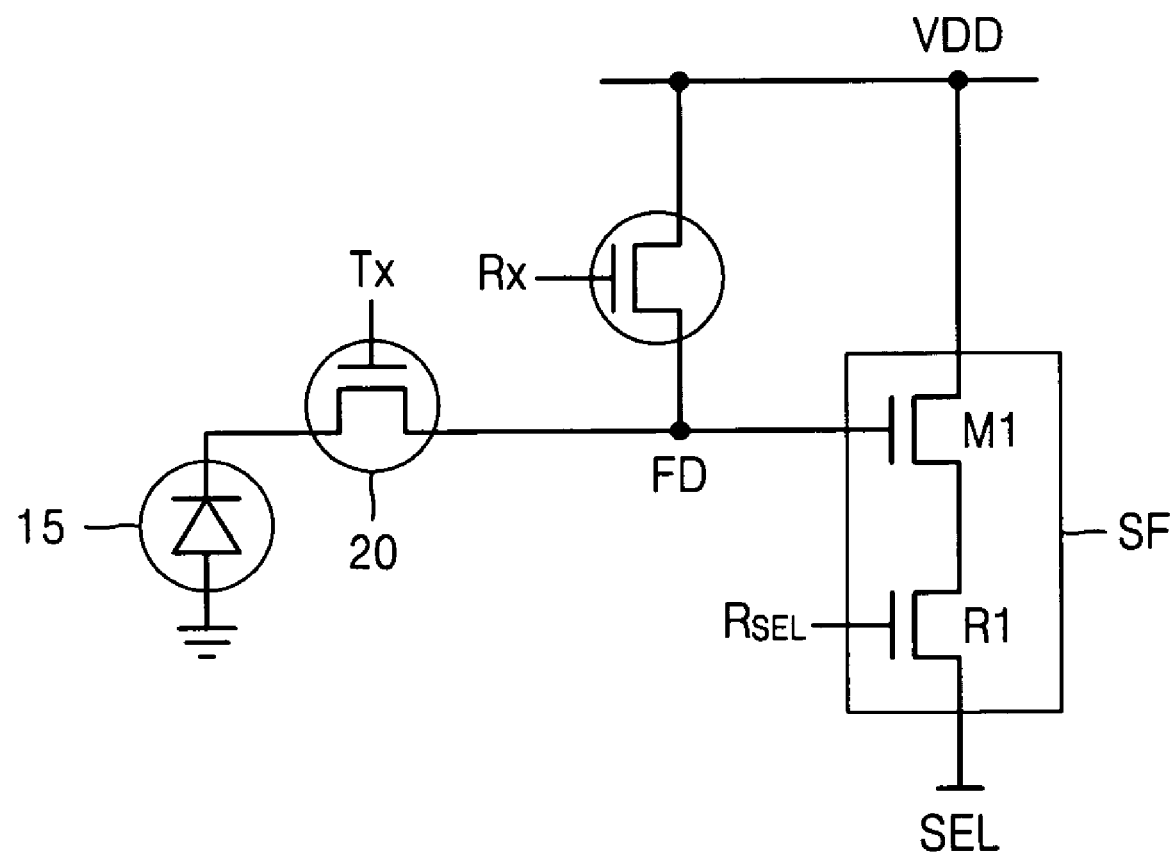
FIG. 1A is a circuit diagram illustrating a unit pixel of a conventional CMOS image sensor.
Figure 1B:
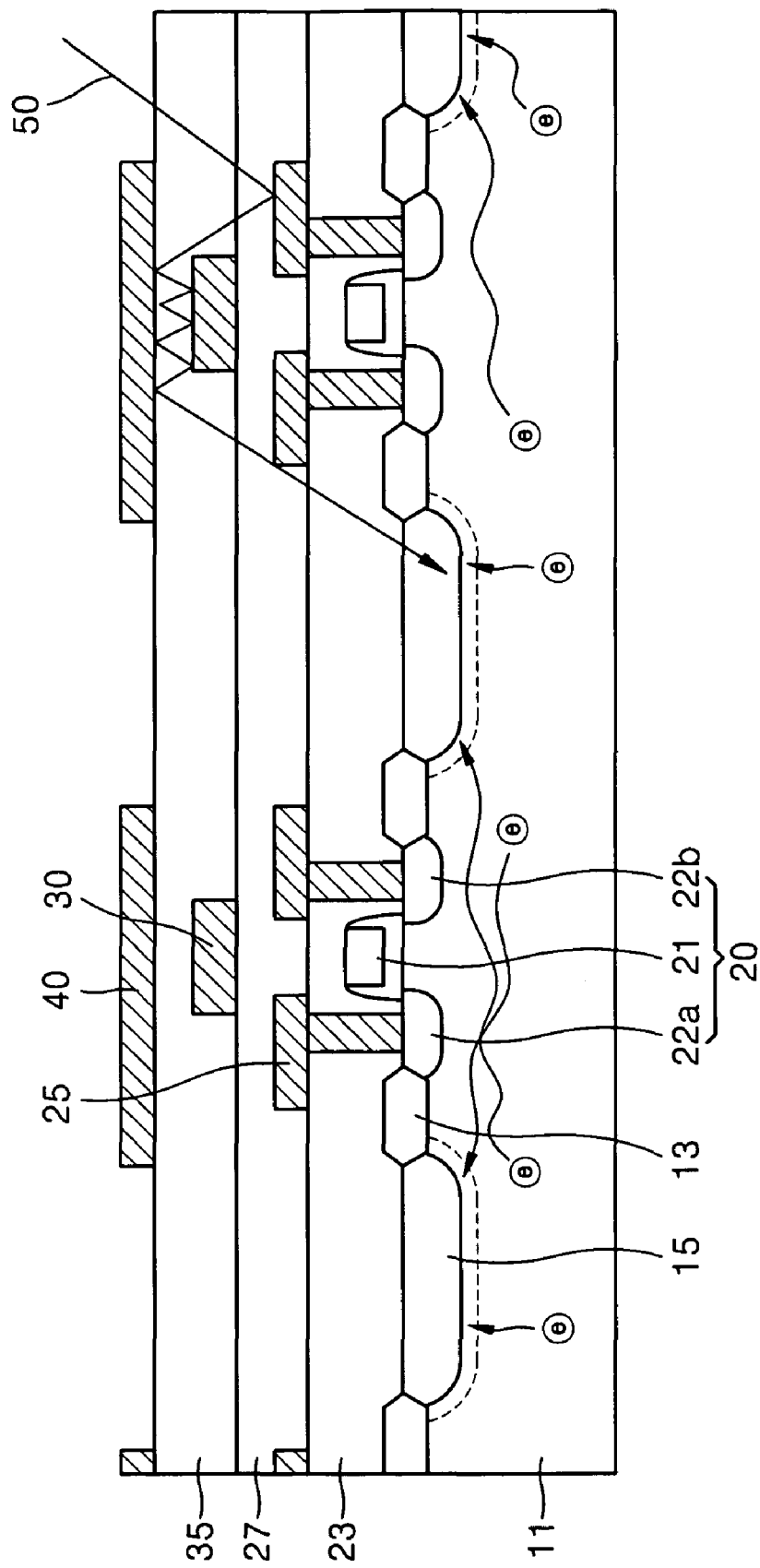
FIG. 1B shows a unit pixel of the CMOS image sensor of FIG. 1A having a photodiode and a transfer transistor integrated on a semiconductor substrate.

Hereinafter, exemplary embodiments of the present invention will be described in detail with reference to the accompanying drawings. In the drawings, the size and relative sizes of layers and regions may be exaggerated for clarity. Like reference numerals refer to similar or identical elements throughout the description of the figures.

According to an exemplary embodiment of the present invention, a light blocking pattern is formed on a region surrounding a periphery of a photodiode to block reflection of inclined incident light, such as inclined incident light with wide angle of incidence, and crosstalk is suppressed. By forming a floatable oxide layer on an upper surface of the light blocking pattern, an inner lens region may be provided by the light blocking pattern. According to an exemplary embodiment of the present invention, an inner lens is formed on the inner lens region, for example, to further improve a converging efficiency of an image sensor.

In an exemplary embodiment of the present invention, an aperture and a curvature of the inner lens of a unit pixel that will have a B filter is designed to be greater than the apertures and the curvatures of the inner lenses of unit pixels that will have an R filter and a G filter, for example, to increase photo sensitivity of the B filter region. In an exemplary embodiment of the present invention, the inner lenses are formed to have the relative sizes of the apertures and the curvatures thereof increase in order of R, G and B color filters. By so doing, the low photo sensitivity of the B color filter is compensated, for example, to improve overall photo sensitivity of the CMOS image sensor.

The dimension of the inner lens may be adjusted by a molding portion formed to shield a periphery of the photodiode. For example, the molding portion may be formed on the plane where the first interconnect is formed, e.g., simultaneously formed with the first interconnect. The molding portion is composed of a material having a thermal endurance property and a light blocking property such as a metal, e.g., tungsten.

The molding portion should not melt when reflow requiring a high temperature of the floatable oxide layer. In an exemplary embodiment of the present invention, the molding portion having the light absorption characteristic surrounds the photodiode, and the inclined incident light is not reflected toward the upper interconnect but absorbed, suppressing the crosstalk.

Figure 2:
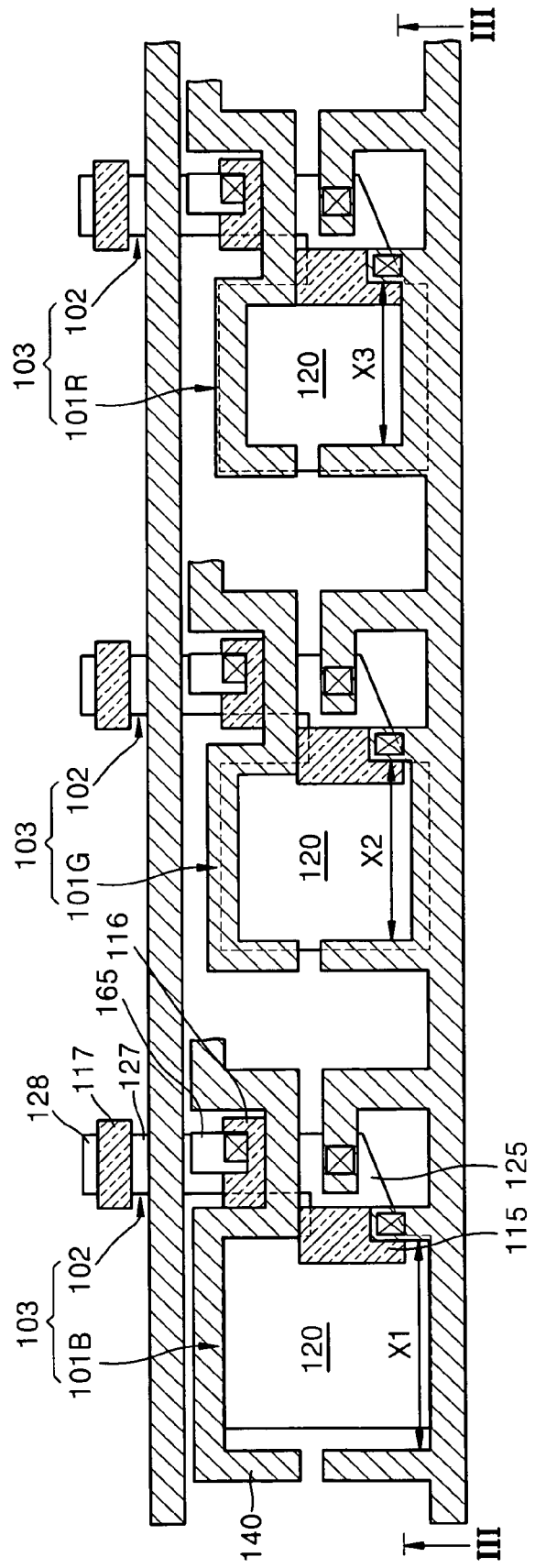
FIG. 2 is a plan view of the CMOS image sensor including molding portions that define inner lenses integrally formed with first metal interconnects according to an exemplary embodiment of the present invention.
Figure 3:
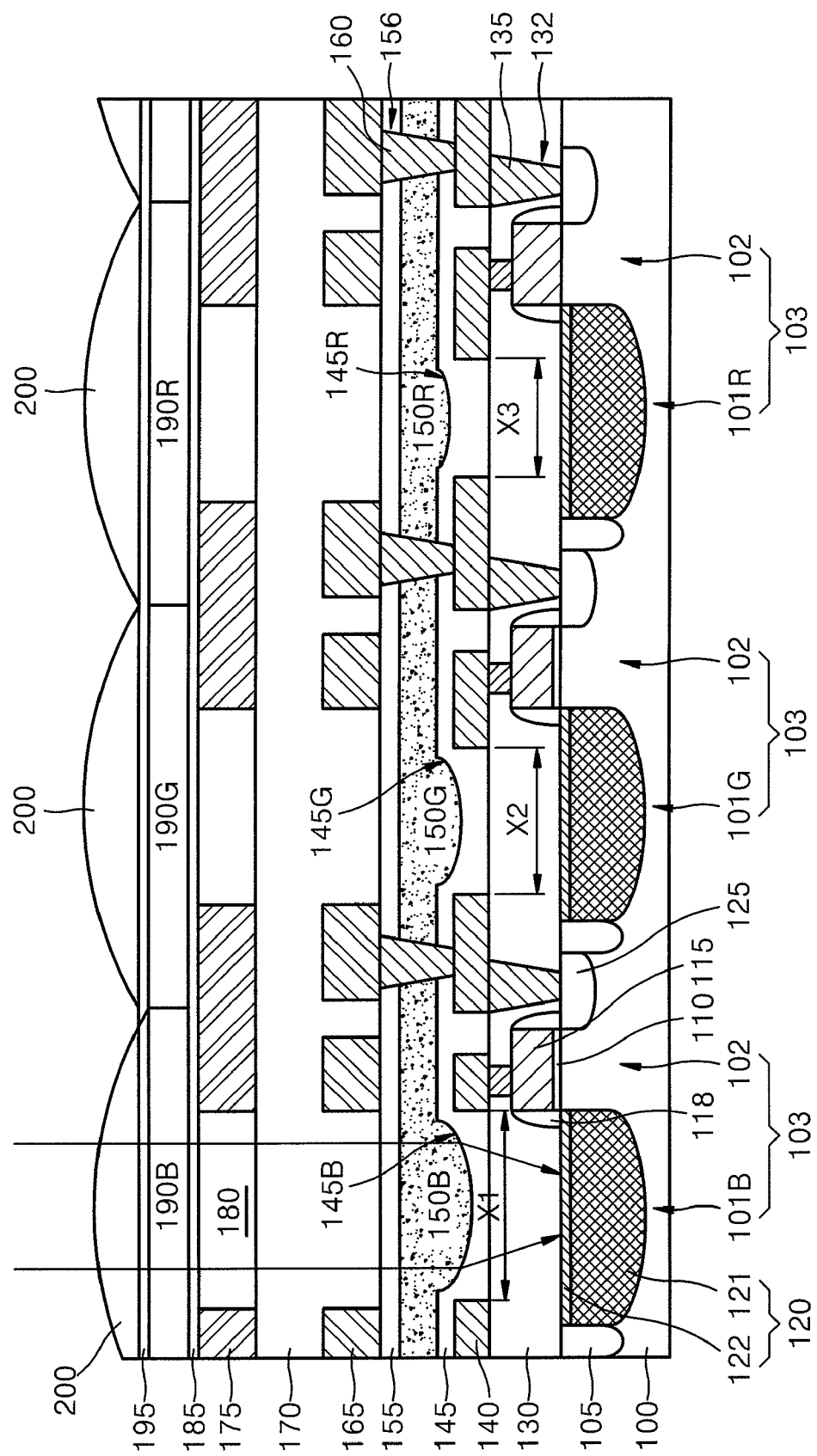
FIG. 3 is a sectional view of the CMOS image sensor cut along a line III-III' of FIG. 2.

FIG. 2 is a plan view of the CMOS image sensor having molding portions that define inner lenses integrally formed with first metal interconnects according to an exemplary embodiment of the present invention. FIG. 3 is a sectional view of the CMOS image sensor cut along a line III-III' of FIG. 2.

Referring to FIGS. 2 and 3, device isolating layers 105 may be formed in a semiconductor substrate 100 using shallow trench isolation (STI) to form a plurality of active regions 103 including pre-photodiode regions 101R, 101G and 101B and pre-transistor regions 102. The reference numeral 101R denotes a pre-photodiode region designed to have an R filter; 101G denotes a pre-photodiode region to have a G filter; and 101B denotes a pre-photodiode region to have a B filter. The plurality of active regions 103 may have the same dimensions.

A gate insulating layer 110 and a conductive layer for a gate electrode, e.g., a doped polysilicon layer, is deposited on the semiconductor substrate 100 where the active region 103 is defined. By patterning the conductive layer, a gate electrode 115 (hereinafter referred to as a "transfer gate electrode") for a transfer transistor, a gate electrode 116 (hereinafter referred to as a "reset gate electrode") for a reset transistor, and a gate electrode 117 (hereinafter referred to as a "source follower gate electrode") of a transistor that comprises a source follower are formed. The transfer gate electrodes 115 may be disposed on boundary portions of the pre-photodiode regions 101R, 101G and 101B, and the pre-transistor regions 102. The reset gate electrodes 116 and the source follower gate electrodes 117 may be disposed on boundaries of the pre-transistor regions 102, respectively. Spacers 118 may be formed on the sidewalls of the gate electrodes 115, 116 and 117, using a well-known method in the art.

The pre-photodiode regions 101R, 101G and 101B are doped with an n-type impurity to form n-type photodiode regions 121. The pre-photodiode regions 101R, 101G and 101B are doped with a p-type impurity to form p-type photodiode regions 122, thereby completing photodiodes 120. For example, the n-type photodiode region 121 is placed deeply in the substrate 100 to induce the electron-hole recombination, and the p-type photodiode region 122 is disposed at a surface of the substrate 100 to remove a potential dark source on the surface of the substrate 100. The photodiode 120 may have the same dimension per unit pixel.

The pre-transistor region 102, disposed on one side of the transfer gate electrode 115, is doped with the n-type impurity to form a floating diffusion region 125. When forming the floating diffusion region 125, source and drain regions 126 of the reset transistor and source and drain regions 127 and 128 of the transistor that constitutes the source follower may be formed. Although the photodiode 120 is formed prior to forming the floating diffusion region in an exemplary embodiment of the present invention, it is to be understood that the photodiode 120 may be formed after forming the floating diffusion region 125.

A first interlayer insulating layer 130, e.g., a silicon oxide layer, is deposited to a predetermined thickness on an upper surface of the resultant structure of the semiconductor substrate 100 having the photodiodes and transistors. The first interlayer insulating layer 130 is etched to open the transfer gate electrode 115, the reset gate electrode 116 and the floating diffusion region 125, thereby forming a contact hole 132. Then, a conductive layer is buried within the contact hole 132 to form a first conductive stud 135. For example, the first conductive stud 135 is composed of a material, e.g., tungsten or doped polysilicon, with an excellent interlayer filling property and an excellent thermal endurance characteristic. First interconnects 140 are formed on an upper surface of the first interlayer insulating layer 130 to contact the exposed first conductive studs 135. The first interconnects 140 according to an exemplary embodiment of the present invention contact the first conductive studs 135 to transfer signals to the transfer gate electrodes 115, the reset gate electrodes 116 and the floating diffusion regions 125. Moreover, the first interconnect 140 acts as a molding portion to construct an inner lens region by surrounding the photodiode 120. The first interconnect 140 is preferably composed of a conductive material with an excellent thermal endurance characteristic and for which the melting point is higher than 1000° C., and a light blocking (absorbing) property, e.g., W, Ti, TiN or a material obtained by stacking Ti/TiN may be used as the interconnect material. The first interconnect 140 height may be 1500~2500 Å. In an exemplary embodiment of the present invention, the inclined incident light is absorbed (blocked) using the molding unit formed to surround the first interconnect 140, particularly photodiode 120, suppressing crosstalk from occurring between the adjacent pixels. For example, the first interconnect 140 may be formed in such a manner that an interval between the molding portions of the unit pixels where the B filter will be disposed is greater than an interval X2 between the molding portions of the unit pixels where the G filter will be disposed and an interval X3 between the molding portions of the unit pixels where the R filter will be disposed. Here, the interval X2 should be greater than the interval X3. This is to make inner lens forming regions have dimensions increased in order of R, G and B filters.

The floatable oxide layer 145 is deposited on an upper surface of the first interlayer insulating layer 130 with the first metal interconnects 140. The floatable oxide layer 145 may be, e.g., a borophosphorus silicate glass (BPSG) layer, a phosphorus silicate glass (PSG) layer, or a composite (stacked) layer of BPSG and PSG. The thickness of the floatable oxide layer 145 directly affects a curvature of an inner lens which will be formed later. As the floatable oxide layer 145 is made thinner, the curvature of the inner lens is improved. But, if the floatable oxide layer 145 is too thin, the surface of the first interconnect 140 is apt to be exposed. Therefore, the thickness of the floatable oxide layer 145 is determined by considering the curvature of the inner lens and coverage of the first interconnect 140.

Thereafter, the floatable oxide layer 145 is thermally treated at a temperature of about 800~1000° C., thereby performing reflow. By doing so, indented portions 145R, 145G, and 145B are formed in regions corresponding to the photodiodes 120 by the intervals and heights of the molding portions of the first metal interconnects 140. The curvature of the indented portions 145R, 145G, and 145B may be proportional to the reflow temperature. Thermal treatment at a higher temperature is preferable for a large curvature, but it should be properly selected within the above-stated temperature range by considering the performance of underlying transistors.

On the other hand, since the intervals of the molding portions 140 are different per unit pixel, the dimensions of the indented portions 145R, 145G and 145B differ from one another. For example, since the intervals X1, X2 and X3 of the molding portions 140 are increased in order of the R, G, and B filters, the dimensions of the indented portions 145R, 145G and 145B are consecutively increased in proportion to the intervals X1, X2 and X3 of the molding portions 140.

According to an exemplary embodiment of the present invention, the first interconnect 140 is composed of a metal for which the melting point is over 1000° C. Therefore, the first interconnect 140 is not melted when performing the high temperature reflow.

Then, an insulating layer for lens is deposited on an upper surface of the floatable oxide layer 145 with the indented portions 145R, 145G and 145B to sufficiently fill the indented portions 145R, 145G and 145B. Preferably, the insulating layer for the lens is composed of a material with refractivity different from that of silicon oxide constituting the floatable oxide layer 145 and the first interlayer insulating layer 130. SiN or SiON may be used for such insulating layer. Then, chemical mechanical planarization (CMP) is performed to a surface of the insulating layer for the lens as much as a predetermined thickness, thereby forming inner lenses 150R, 150G and 150B. The CMP upon the insulating layer for the lens may expose the surface of the first interlayer insulating layer 130.

By forming the indented portions 145R, 145G and 145B with the dimensions increased in order of the R, G and B filters, the dimensions of the inner lenses 150R, 150G and 150B formed within the indented portions 145R, 145G and 145B are increased in order of the R, G and B filters. For example, because the dimensions of the inner lenses 150R, 150G and 150B are proportional to the apertures and curvatures of the inner lenses 150R, 150G and 150B, the aperture and the curvature of the inner lens 150B in the B filter region are increased. Accordingly, the increased aperture of the inner lens 150B allows for picking up of light even in the B filter region that absorbs light of relatively short wavelength, and the improved curvature induces the electron-hole recombination within the substrate 100, improving the photo sensitivity.

A second interlayer insulating layer 155 is deposited on an upper surface of the inner lens 150. Then, the second interlayer insulating layer 155, the inner lens 150 and the floatable oxide layer 145 are etched to expose a predetermined portion of the first interconnect 140, thereby forming a via hole 156. A second conductive stud 160 is formed to fill the via hole 156 by a well-known method in the art. The second conductive stud 160 may be composed of a material, e.g., tungsten, with an excellent interlayer filling characteristic. A second interconnect 165 is formed on an upper surface of the second interlayer insulating layer 155 to contact with the second conductive stud 160. The second interconnect 165 may be composed of a metal with an excellent conduction characteristic, e.g., Al or an Al alloy. At this point, the first and second metal interconnects 140 and 165 may be formed on the peripheries of the photodiodes 120 as is well known in the art. A third interlayer insulating layer 170 is formed on an upper surface of the second interlayer insulating layer 155 having the second interconnect 165. Here, the third interlayer insulating layer 170 may be a planarization layer. Subsequently, a light blocking layer 175 is formed on the third interlayer insulating layer 170 to expose the photodiode portion 120. After filling a fourth interlayer insulating layer 180 between the light blocking layers 175, a first protection layer 185 is formed on the upper surfaces of the light blocking layers 175 and the fourth interlayer insulating layers 180. Color filters 190R, 190G and 190B are formed on an upper surface of the first protection layer 185. For example, the color filters 190R, 190G and 190B are arranged to correspond to the photodiodes 120, and the boundary portions of respective color filters 190R, 190B and 190G exist on the light blocking layers 175. Thereafter, a second protection layer 195 is formed on upper surfaces of the color filters 190R, 190G and 190B, and micro lenses 200 are formed on upper surfaces of the color filters 190R, 190G and 190B. The micro lenses 200 correspond to the photodiodes 120, respectively.

In an exemplary embodiment of the present invention, the molding portion that defines the inner lens region is integrally formed with the first interconnect 140, but the molding portion may be formed separately from the first interconnect 140.

Figure 4:
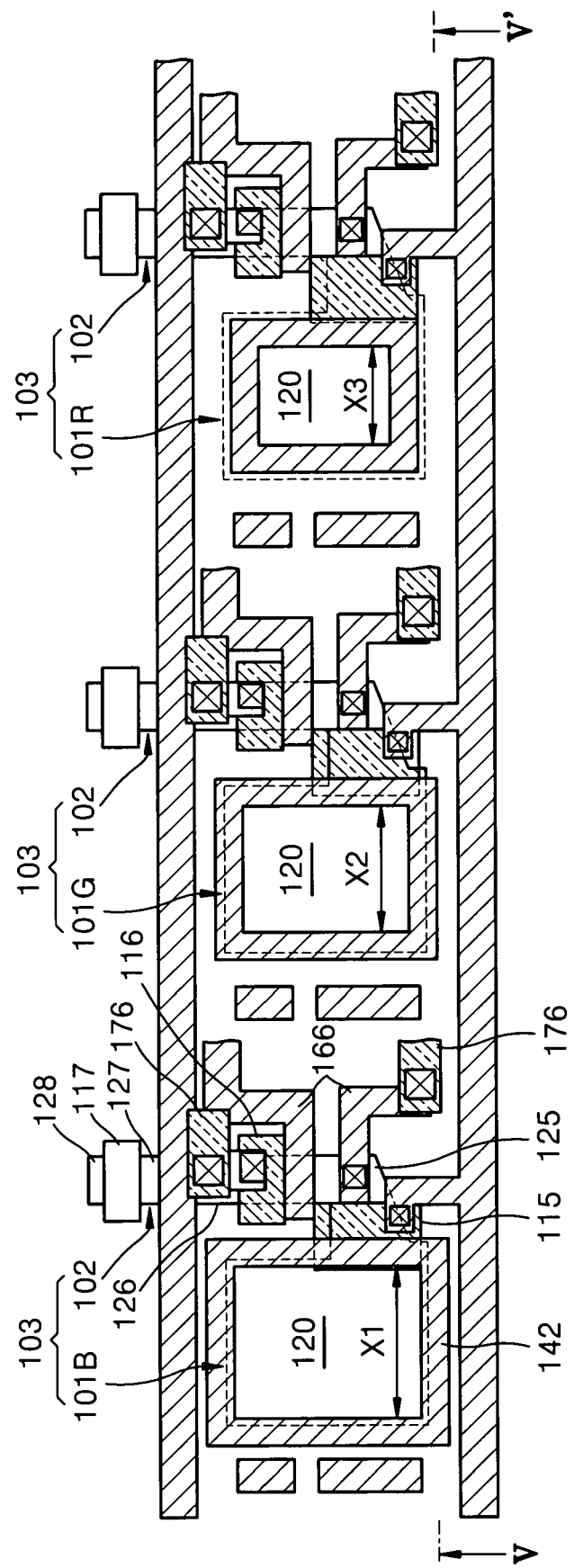
FIG. 4 is a plan view of a CMOS image sensor having molding portions that define inner lenses separately formed from a first metal interconnects according to another exemplary embodiment of the present invention.
Figure 5:
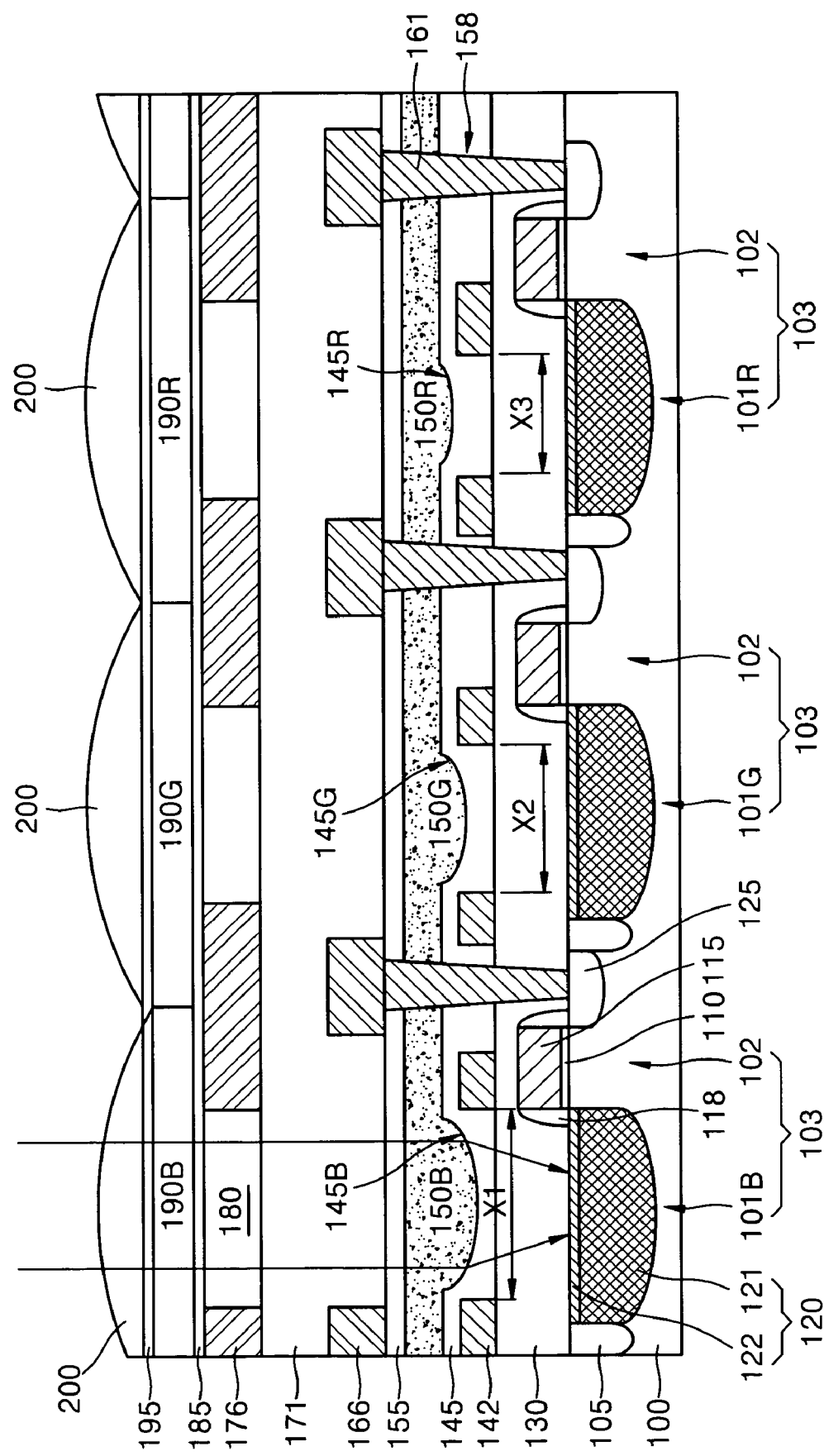
FIG. 5 is a sectional view of the CMOS image sensor cut along a line V-V' of FIG. 4.

FIG. 4 is a plan view of a CMOS image sensor having molding portions that define inner lenses separately formed from a first metal interconnects according to an exemplary embodiment of the present invention. FIG. 5 is a sectional view of the CMOS image sensor cut along a line V-V' of FIG. 4

Referring to FIGS. 4 and 5, after forming the first interlayer insulating layer 130, a light blocking layer to form the molding portion is deposited on an upper surface of the first interlayer insulating layer 130. The light blocking layer may be a conductive layer composed of a material, e.g., tungsten, titanium, titanium nitride or titanium/titanium nitride, to have an excellent endurance against the high temperature, e.g., with a melting point over 1000° C. Then, the light blocking layer is patterned to surround the periphery of the photodiode 120, thereby forming a molding portion 142.

For example, the molding portions 142 are designed to have dimensions, i.e., areas of the photodiodes 120 that will be exposed by the molding portions 142, increased in order of the R, G and B filters as described above. Thereafter, the floatable oxide layer 145, e.g., a BPSG layer, a PSG layer or a composite (or stacked) layer of BPSG and PSG, is formed on the upper surfaces of the molding portion 142 and the first interlayer insulating layer 130. The floatable oxide layer 145 is thermally treated at a temperature of 800~1000° C., performing reflow, and indented portions 145R, 145G and 145B that are inner lens forming regions are formed within the floatable oxide layer 145. As described above, since the dimensions of the indented portions 145R, 145G and 145B are determined by the heights and intervals of the molding portions 142, the dimension of the molding portion 142 is larger in order of the R, G and B filters to increase the dimensions of the indented portion 145R, 145G and 145B in order of the R, G and B filters. The molding portion 142 may be composed of metal, e.g., tungsten, titanium, titanium nitride or titanium/titanium nitride, with an excellent thermal endurance property, so that the reflow performed at the high temperature does not affect the shape of the molding portion 142.

An insulating layer for the lens is deposited on an upper surface of the floatable oxide layer 145. The insulating layer for the lens may be composed of a material, e.g., SiN or SiON, with refractivity different from that of the floatable oxide layer 145. CMP is performed to the insulating layer for the lens to be left within the indented portions 145R, 145G and 145B, thereby forming inner lenses 150R, 150G and 150B.

Since the indented portions 145R, 145G and 145B have different dimensions in accordance with the R, G and B filters, the inner lenses 150R, 150G and 150B have different dimensions depending on the dimensions of the indented portions 145R, 145G and 145B. In other words, the relative apertures and curvatures of the inner lenses 150R, 150G and 150B gradually increase in order of the R, G and B color filters.

After depositing a second interlayer insulating layer 155 on upper surfaces of the inner lenses 150R, 150G and 150B, the second interlayer insulating layer 155, the floatable oxide layer 145 and the first interlayer insulating layer 130 are etched to expose predetermined portions of the floating diffusion region 125, the transfer gate electrode 115 and the reset gate electrode 116, thereby forming a contact hole 158. The first conductive stud 161 is formed to fill in the contact hole 158 using a well known method. For example, the first conductive stud 161 may be composed of a tungsten metal layer with the excellent interlayer filling and light blocking properties. A first interconnect 166 is formed on an upper surface of the floatable oxide layer 145 to electrically contact with the first conductive stud 161. The first interconnect 166 may be composed of aluminum or aluminum alloy or other material with an excellent conduction property. The molding portion 152 according to an exemplary embodiment of the present invention is disposed on a surface other than that of the first interconnect 166, there is an interconnect margin greater than the case of simultaneously forming the molding portion and the metal interconnect. Accordingly, the molding portion 142 is wider than the first interconnect (140 of FIG. 3) that surrounds the photodiode 120.

A third interlayer insulating layer 171 is formed on an upper surface of the second interlayer insulating layer 155 with the first interconnect 166. A second interconnect 176 is formed on an upper surface of the third interlayer insulating layer 171 to be electrically connect to a predetermined portion of the first interconnect 166. For example, the second interconnect 176 may be used as an upper light blocking layer of the CMOS image sensor. Moreover, the first and second metal interconnects 166 and 176 may be placed on the outer periphery of the photodiode 120 so as not to affect the image pickup by the photodiode 120. After forming a fourth interlayer insulating layer 180 between the second metal interconnects 176, a first protection layer 185, R, G and B color filters 190R, 190G and 190B, a second protection layer 195 and a micro lens 200 are subsequently formed.

In the case where the molding portions 142 that define the inner lenses 150R, 150G and 150B are formed separately from the first metal interconnects, the sidewalls of the molding portions 142 may be inclined to improve the curvatures of the inner lenses 150R, 150G and 150B.

Figure 6:
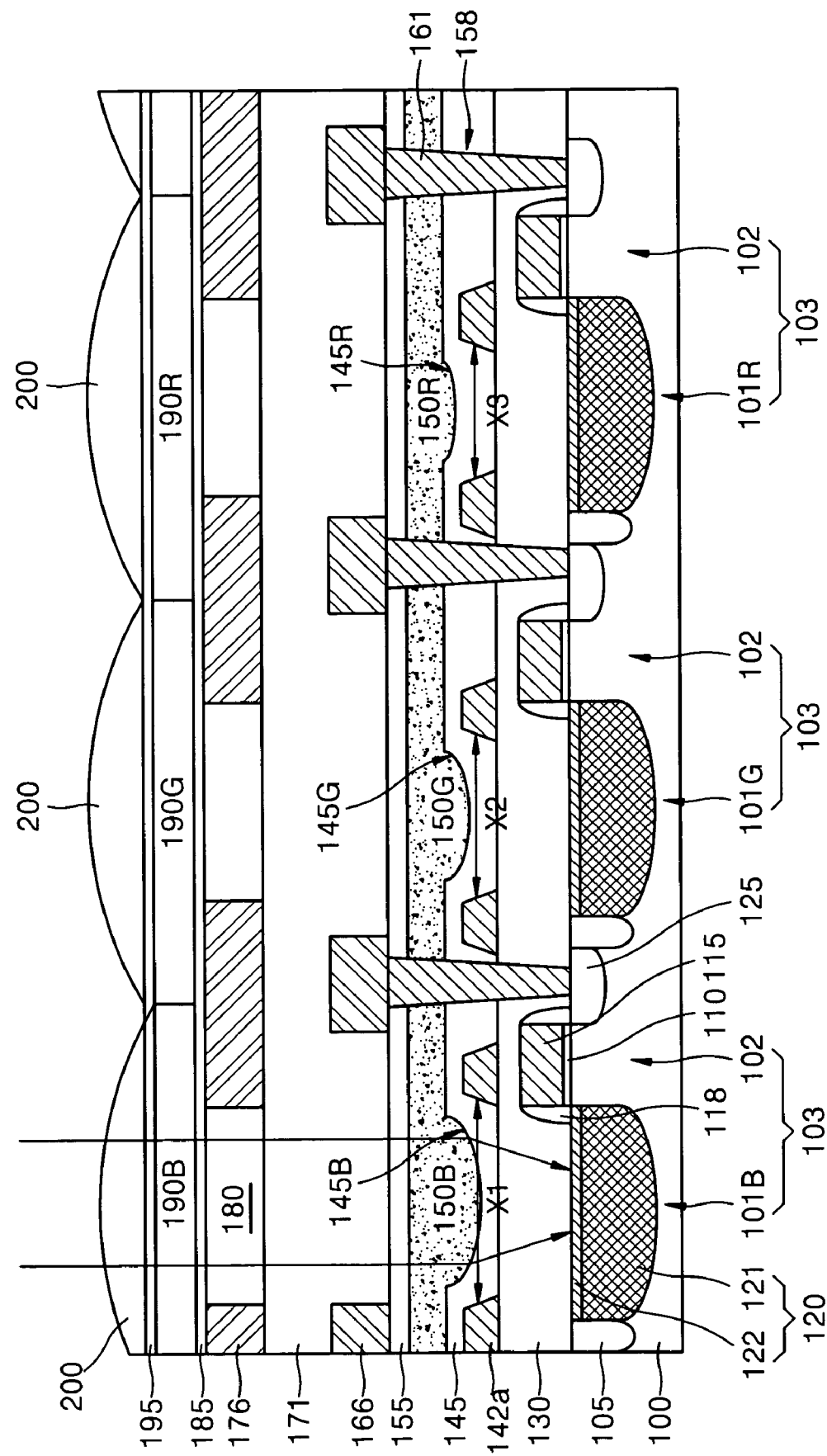
FIGS. 6 through 8 are sectional views showing the CMOS image sensor having the molding portions with slanted sidewalls according to another exemplary embodiment of the present invention.
Figure 7:
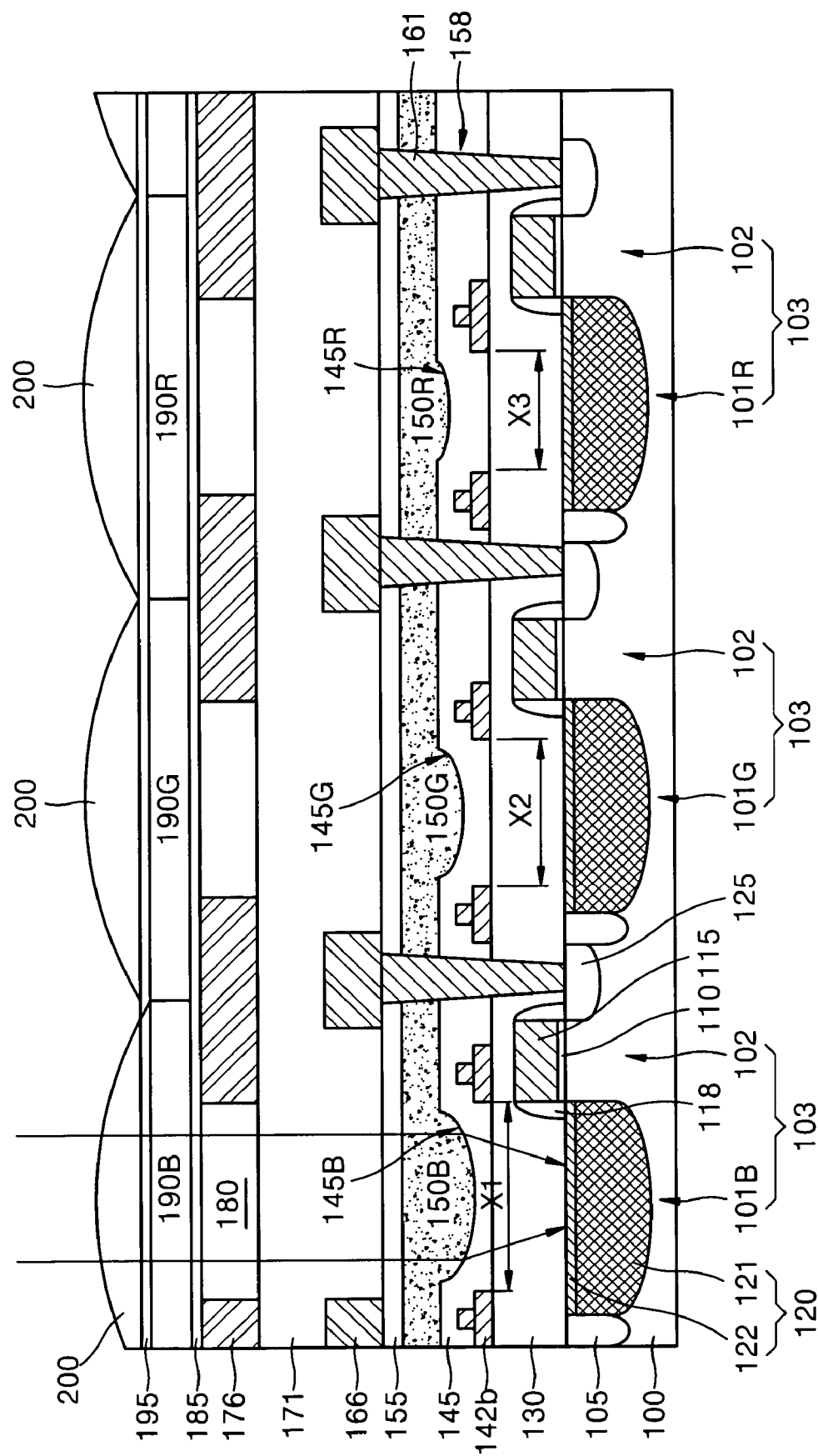
Figure 8:
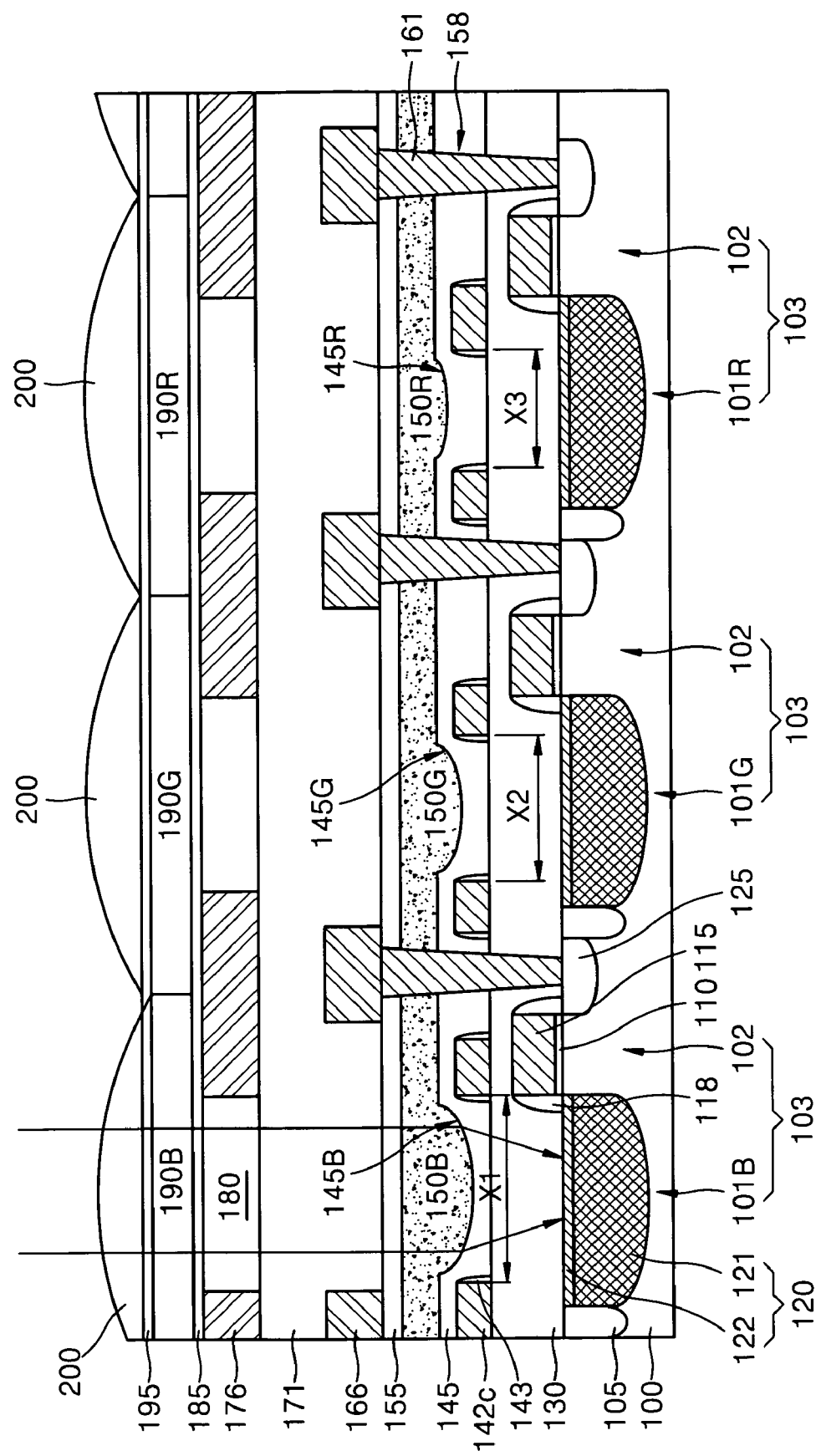

FIGS. 6 through 8 are sectional views showing the CMOS image sensor having the molding portions with slanted sidewalls according to an exemplary embodiment of the present invention. Referring to FIG. 6, molding portions 142a with the inclined sidewalls are obtained by taper-etching the metal layer. In an exemplary embodiment of the present invention, the molding portion 142 obtained by the taper-etching has a trapezoidal shape, and the inclination on the sidewalls of the molding portions 142 further improve the curvatures of the inner lenses 150R, 150G and 150B.

Referring to FIG. 7, molding portions 142b are provided by multiple-layered interconnects with different line widths, so that the sidewall thereof may have a step-like slope. In this case, the curvatures of the inner lenses 150R, 150G and 150B may be further improved by the inclination of the molding portion 142b.

Referring to FIG. 8, spacers 143 are formed on the sidewalls of the molding portions 142 with no sidewall inclination, thereby slanting the sidewalls of molding portions 142c. The spacer 143 may comprise an insulating material, e.g., silicon nitride, for which the refractivity is different from that of silicon oxide.

In the case where the molding portion 142 has the slanted sidewall, the curvature of the inner lenses 150R, 150G and 150B can be secured even if reflow is omitted.

Figure 9:
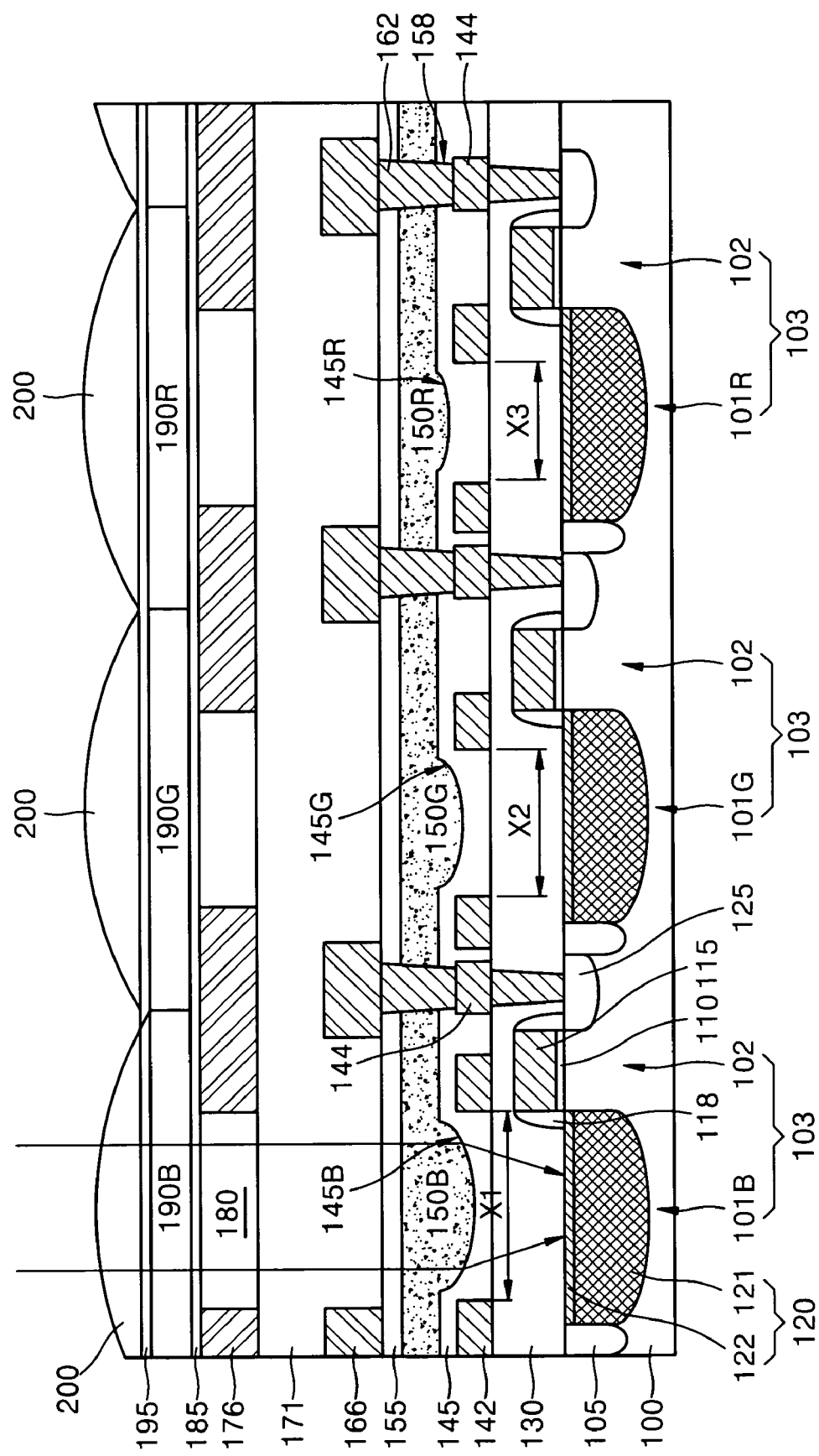
FIG. 9 is a sectional view showing the CMOS image sensor having landing pads according to another exemplary embodiment of the present invention.

Referring to FIG. 9, the first stud 135 is formed within the first interlayer insulating layer 130, and a landing pad 144 is formed on an upper surface of the first interlayer insulating layer 130 to contact with the first stud 135. The landing pads 144 may be simultaneously formed with the molding portions 142 in the form of local islands.

Thereafter, a second stud 162 in contact with the second interlayer insulating layer 155, the inner lenses 150R, 150G and 150B and the floatable oxide layer 145 is formed, for example, using the well-known method in the art. Then, the first interconnect 166 is formed to contact the second stud 162.

By forming the landing pad 144 between the first interlayer insulating layer 130 and the floatable oxide layer 145 together with the molding portion 142, the contact of a conductive pad (or contact stud) in contact with the first interconnect 145 is improved.

According to exemplary embodiments of the present invention as described above, molding portions with a thermal endurance characteristic and a light blocking characteristic are formed to surround photodiodes that comprise a CMOS image sensor, and an inclined incident light is not reflected toward an upper interconnect but blocked, suppressing crosstalk between adjacent pixels.

In accordance with an exemplary embodiment of the present invention, a floatable oxide layer is formed on an upper surface of a resultant structure having an light blocking pattern thereon, and reflow is performed form inner lens regions corresponding to the photodiodes by the step-like light blocking pattern, and converging efficiency of the CMOS image sensor is further improved to enhance sensitivity of the image sensor.

According to an exemplary embodiment of the present invention, dimensions of the molding portions are varied to make the apertures and curvatures of the inner lenses increase in order of the R, G and B color filters, and the quantity of optical pickup in the B filter region that absorbs the relatively short wavelength light is increased, and electron-hole reunion is induced deeply in a substrate, improving the photo sensitivity of the B filter region. Moreover, the inner lens formed in the R filter region can maintain the high photo sensitivity because the R filter absorbs the long wavelength light even if the aperture and the curvature are less than those of the inner lens formed in the B filter region. Consequently, the photo sensitivity of the CMOS image sensor can be consistent.

Although the exemplary embodiments of the present invention have been described in detail with reference to the accompanying drawings for the purpose of illustration, it is to be understood that the inventive processes and apparatus are not be construed as limited thereby. It will be readily apparent to those of ordinary skill in the art that various modifications to the foregoing exemplary embodiments may be made without departing from the scope of the invention as defined by the following appended claims, with equivalents of the claims to be included therein.

What is claimed is:

1. A CMOS image sensor comprising:
a semiconductor substrate having photodiodes and transistors;
an interlayer insulating layer formed on the resultant structure having the photodiodes and transistors; and
light blocking patterns formed on the interlayer insulating layer, and surrounding peripheries of the photodiodes,
wherein R, G and B color filters are formed on upper surfaces of the light blocking patterns to correspond to the photodiodes, respectively, and areas of the photodiodes exposed by the light blocking patterns differ from one another per R, G and B color filters,
wherein the areas of the photodiodes exposed by the light blocking patterns are gradually increased in order of the R, G and B filters.

2. The CMOS image sensor of claim 1, wherein the light blocking pattern comprises a layer selected from a group consisting of a tungsten layer, a titanium layer, a titanium nitride layer, and a stacked layer of titanium and titanium nitride.

3. The CMOS image sensor of claim 1, wherein the light blocking pattern is floating.

4. The CMOS image sensor of claim 1, wherein the light blocking pattern is supplied with an electrical signal.

5. The CMOS image sensor of claim 1, wherein the areas of the photodiodes exposed by the light blocking patterns are gradually increased in order of the R, G and B filters.

6. A CMOS image sensor comprising:
a semiconductor substrate having photodiodes and transistors;
an interlayer insulating layer formed on the resultant structure having the photodiodes and transistors;
molding portions formed on the interlayer insulating layer, and composed of an light blocking material to surround peripheries of the photodiodes;
a floatable oxide layer formed on the interlayer insulating layer having the molding portions, and having indented portions formed by steps of the molding portions;
inner lenses formed within the indented portions of the floatable oxide layer; and R, G and B color filters formed on an upper surface of the semiconductor substrate having the inner lenses, and arranged to correspond to the inner lenses, wherein the molding portions are formed to allow areas of the photodiode regions exposed by the molding portions to be increased in order of the R, G and B filters, thereby increasing apertures of the inner lenses in order of the R, G and B filters.

7. The CMOS image sensor of claim 6, wherein the molding portion is composed of a material with a melting point over 1000° C.

8. The CMOS image sensor of claim 7, wherein the molding portion comprises a layer selected from a group consisting of a tungsten layer, a titanium layer, a titanium nitride layer and a stacked layer of titanium and titanium nitride.

9. The CMOS image sensor of claim 6, wherein the molding portion comprises a slanted sidewall.

10. The CMOS image sensor of claim 6, wherein the molding portion comprises a first pattern formed on an upper surface of the interlayer insulating layer and a second pattern formed on the first pattern and narrower than the first pattern.

11. The CMOS image sensor of claim 6, further comprising spacers on both sidewalls of the molding portions.

12. The CMOS image sensor of claim 6, further comprising a metal interconnect electrically connected to a transistor between the floatable oxide layer and the interlayer insulating layer, wherein the metal interconnected is electrically connected to the molding portion.

13. The CMOS image sensor of claim 12, wherein the metal interconnect comprises the same material as the molding portion.

14. The CMOS image sensor of claim 6, further comprising a metal interconnect electrically connected to a selected portion of the transistor on an upper surface of the floatable oxide layer, wherein the metal interconnect is electrically insulated from the molding portion.

15. The CMOS image sensor of claim 6, further comprising:
first conductive studs formed within the interlayer insulating layer, and electrically connected to the selected portions of the transistors; landing pads formed on the interlayer insulating layer to contact the first conductive studs;
second conductive studs formed within the floatable oxide layer, and electrically connected to the landing pads; and
metal interconnects formed on the second conductive studs, wherein the landing pads are spaced apart from the molding portions, and comprises the same material as the molding portions.

16. The CMOS image sensor of claim 6, wherein the floatable oxide layer is a layer selected from a group consisting of a borophosphorus silicate glass (BPSG) layer, a phosphorus silicate glass (PSG) layer, and a composite layer of BPSG and PSG.

17. The CMOS image sensor of claim 6, wherein the inner lens comprises a material with refractivity different from those of the floatable oxide layer and the interlayer insulating layer.

18. A CMOS image sensor comprising:
a semiconductor substrate including a plurality of unit pixels having photodiodes and transistors;
an interlayer insulating layer formed on the semiconductor substrate;
molding portions formed on an upper surface of the interlayer insulating layer, and surrounding the photodiodes per unit pixels;
a floatable oxide layer formed on an upper surface of the interlayer insulating layer, and having indented portions defined by the molding portions;
inner lenses respectively formed in the indented portions; and
R, G and B color filters formed on an upper surface of the semiconductor substrate having the inner lenses, and arranged to correspond to the inner lenses, wherein the molding portions are formed to allow areas of the photodiode regions exposed by the molding portions to be increased in order of the R, G and B filters, thereby increasing apertures of the inner lenses in order of the R, G and B filters.

19. The CMOS image sensor of claim 18, further comprising metal interconnects on an upper surface of the interlayer insulating layer to supply electrical signals to the transistors.

20. The CMOS image sensor of claim 19, wherein the molding portion and the metal interconnect are composed of the same material, and wherein the material is a layer selected from a group consisting of a tungsten layer, a titanium layer, a titanium nitride layer, and a stacked layer of titanium and titanium nitride.

21. The CMOS image sensor of claim 18, wherein the floatable oxide layer is a layer selected from a BPSG layer, a PSG layer or a stacked layer of BPSG and PSG.

22. The CMOS image sensor of claim 18, wherein the inner lenses are formed on a surface of the floatable oxide layer having the indented portions.

23. The CMOS image sensor of claim 18, wherein the inner lens comprises an insulating layer with refractivity different from those of the floatable oxide layer and the interlayer insulating layer.

24. The CMOS image sensor of claim 23, wherein the inner lens comprises SiN or SiON.

25. The CMOS image sensor of claim 19, further comprising at least one upper metal interconnect between the metal interconnect and the R, G and B color filters to transfer a signal to the metal interconnect, wherein the upper metal interconnects are disposed on the peripheries of the photodiodes.

26. The CMOS image sensor of claim 18, wherein the molding portions comprise a slanted sidewall.

27. The CMOS image sensor of claim 26, wherein the molding portions comprise a trapezoidal shape.

28. The CMOS image sensor of claim 18, wherein the molding portions comprise two patterns with different line widths to have a stepped slope.

29. The CMOS image sensor of claim 18, wherein the molding portions include spacers on the sidewalls.

* * * * *